(12) United States Patent
Kanaya et al.

(10) Patent No.: US 9,266,470 B2
(45) Date of Patent: Feb. 23, 2016

(54) VEHICLE APPROACH INFORMING DEVICE

(71) Applicant: Fuji Jukogyo Kabushiki Kaisha, Tokyo (JP)

(72) Inventors: Hiroaki Kanaya, Tokyo (JP); Tsukasa Murakami, Tokyo (JP)

(73) Assignee: FUJI JUKOGYO KABUSHIKI KAISHA, Tokyo (JP)

( * ) Notice: Subject to any disclaimer, the term of this patent is extended or adjusted under 35 U.S.C. 154(b) by 136 days.

(21) Appl. No.: 14/169,001

(22) Filed: Jan. 30, 2014

(65) Prior Publication Data

US 2014/0226835 A1 Aug. 14, 2014

(30) Foreign Application Priority Data

Feb. 13, 2013 (JP) ................................ 2013-025364

(51) Int. Cl.
H04B 1/00 (2006.01)
B60Q 5/00 (2006.01)
H03G 7/00 (2006.01)

(52) U.S. Cl.
CPC . B60Q 5/008 (2013.01); H03G 7/00 (2013.01)

(58) Field of Classification Search
CPC ................................ B60Q 5/008; B60Q 9/007
See application file for complete search history.

(56) References Cited

U.S. PATENT DOCUMENTS

| 8,958,947 | B2 | 2/2015 | Inakazu et al. | |
|---|---|---|---|---|
| 2012/0062391 | A1* | 3/2012 | Pan ............................... | 340/901 |
| 2013/0184940 | A1* | 7/2013 | Stoll et al. ...................... | 701/45 |
| 2014/0210602 | A1 | 7/2014 | Yokoyama et al. | |
| 2014/0225726 | A1 | 8/2014 | Kanaya et al. | |

FOREIGN PATENT DOCUMENTS

| JP | 2006-298111 | 11/2006 |
|---|---|---|
| JP | 2009-040318 | 2/2009 |
| JP | 2011-148435 | 8/2011 |
| JP | 2012-201316 | 10/2012 |
| WO | 2011/104755 | 9/2011 |

\* cited by examiner

*Primary Examiner* — Joseph Saunders, Jr.
*Assistant Examiner* — James Mooney
(74) *Attorney, Agent, or Firm* — Smith, Gambrell & Russell, LLP

(57) ABSTRACT

A vehicle approach informing device includes: an informing sound output unit to output informing sound for informing to a pedestrian outside a vehicle that the vehicle is approaching when a predetermined condition is satisfied; a sound volume control unit to control the volume of the informing sound outputted by the informing sound output unit; and a shield detection unit to detect a shield present on any side ahead in a running direction of the vehicle. When a shield is detected by the shield detection unit, the sound volume control unit reduces the volume of the informing sound which is outputted by the informing sound output unit.

10 Claims, 6 Drawing Sheets

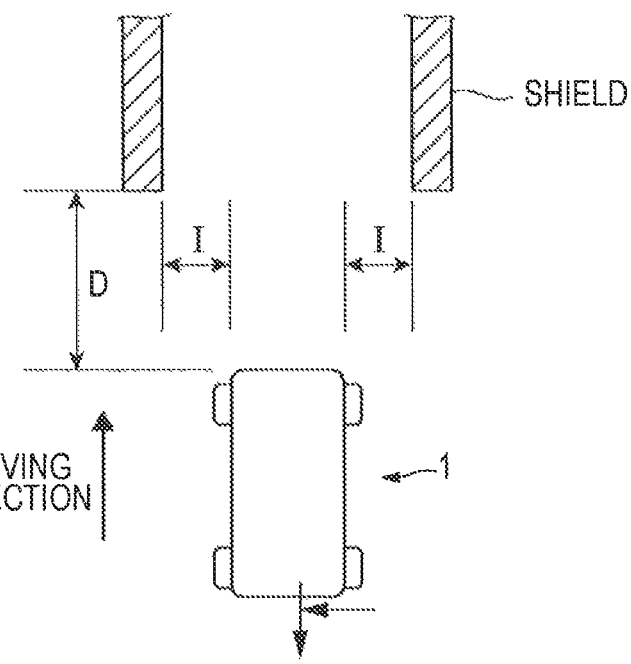
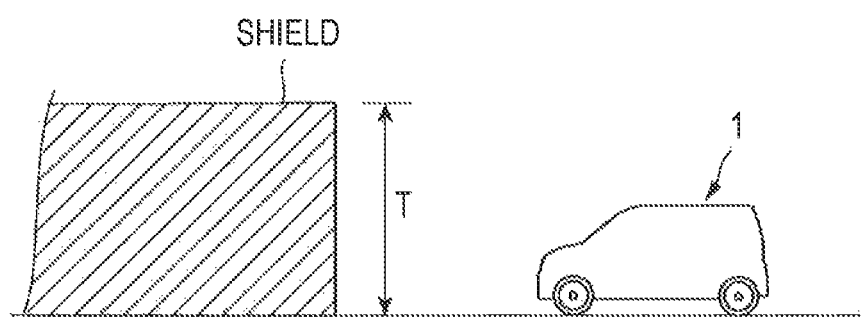

FIG. 5A

FIRST INFORMING SOUND VOLUME
REDUCTION RATE DETERMINATION TABLE

| PRESENCE OF SHIELD | REDUCTION RATE |
|---|---|
| NOT PRESENT | ±0 |
| PRESENT ONLY ON ONE SIDE | 25% |
| PRESENT ON BOTH SIDES | 50% |

FIG. 5B

SECOND INFORMING SOUND VOLUME
REDUCTION RATE DETERMINATION TABLE

| PRESENCE OF CEILING | REDUCTION RATE |
|---|---|
| NOT PRESENT | ±0 |
| PRESENT | 25% |

FIG. 5C

THIRD INFORMING SOUND VOLUME
REDUCTION RATE DETERMINATION TABLE

| SHIELD HEIGHT T | REDUCTION RATE |
|---|---|
| LESS THAN 2 m | ±0 |
| NOT LESS THAN 2 m | 10% |

FIG. 6

INFORMING SOUND VOLUME REDUCTION
PERFORMANCE RATE DETERMINATION TABLE

|  |  | REDUCTION PERFORMANCE RATE |
|---|---|---|
| DISTANCE D | 10 m OR GREATER * | 0% |
|  | GREATER THAN 0 m AND LESS THAN 10 m | 50% |
|  | 0 m | 100% |
| SPACE INTERVAL I | 3 m OR GREATER * | 0% |
|  | 1 m OR GREATER AND LESS THAN 3 m | 50% |
|  | LESS THAN 1 m | 100% |

* WHEN DISTANCE D IS 10 m OR GREATER, REDUCTION PERFORMANCE RATE IS 0% REGARDLESS OF SPACE INTERVAL

* WHEN SPACE INTERVAL I IS 3 m OR GREATER, REDUCTION PERFORMANCE RATE IS 0% REGARDLESS OF DISTANCE D

VEHICLE APPROACH INFORMING DEVICE

CROSS-REFERENCE TO RELATED APPLICATIONS

The present application claims priority from Japanese Patent Application No. 2013-025364 filed on Feb. 13, 2013, the entire contents of which are hereby incorporated by reference.

BACKGROUND

1. Technical Field

The present invention relates to a vehicle approach informing device configured to inform pedestrians and the like outside a vehicle that the vehicle is approaching.

2. Related Art

Conventional vehicles are primarily a gasoline powered vehicle which runs using an engine as a drive source, and so a pedestrian can identify the presence of a vehicle by the engine sound generated by the vehicle when the vehicle is approaching from the rear or a blind spot of the pedestrian. However, no engine sound is generated by a vehicle such as an electric vehicle and a hybrid vehicle which run using an electric motor as a drive source, and it is difficult for a pedestrian to recognize whether the vehicle is approaching, by the sound of the vehicle.

Thus, vehicles equipped with an informing device have been proposed, the informing device being configured to output sound for informing people outside the vehicle such as pedestrians that the vehicle is approaching. For example, Japanese Unexamined Patent Application Publication No. 2009-40318 discloses a vehicle approach informing device configured to output simulated sound of tire noise from a speaker provided at the front end of a vehicle when the vehicle is running at a speed lower than or equal to a predetermined vehicle speed, the simulated sound having the same tone as that of the actual tire noise.

However, in an area such as a residential area or a tunnel where a shield such as a wall is installed. on each side of a road, sound reverberates through the shield and tends to be amplified. When informing sound for informing vehicle approach. is outputted in such an area, the informing sound reverberates and is amplified. The amplified informing sound may not only give discomfort to a driver, but also become annoying noise to the surroundings.

SUMMARY OF THE INVENTION

The present invention has been designed in consideration of the circumstances described above, and an object thereof is to provide a vehicle approach informing device which can prevent the informing sound from becoming annoying noise even in an area where sound tends to reverberate.

An aspect of the present invention provides a vehicle approach informing device including: an informing sound output unit to output informing sound for informing a pedestrian outside a vehicle that the vehicle is approaching when a predetermined condition is satisfied; a sound volume control unit to control the volume of the informing sound outputted by the informing sound output unit; and a shield detection unit configured to detect a shield present on any side ahead in the running direction of the vehicle. When a shield is detected by the shield detection unit, the sound volume control unit reduces the volume of the informing sound to be outputted by the informing sound output unit.

Preferably, when a shield is detected on each of both sides ahead in the running direction of the vehicle by the shield detection unit, the sound volume control unit reduces the volume of the informing sound to a lower level than the volume of the informing sound when a shield is detected only on one side ahead in the running direction of the vehicle.

Preferably, the shield detection unit includes a distance measurement unit to measure a distance between the detected shield and the vehicle, and the sound volume control unit controls the volume of the informing sound to be outputted by the informing sound output unit according to the distance measured by the distance measurement unit.

Preferably, the shield detection unit includes a space interval measurement unit to measure a space interval between the detected shield and the corresponding side of the vehicle, and the sound volume control unit controls the volume of the informing sound to be outputted by the informing sound output unit according to the space interval measured by the space interval measurement unit.

Preferably, the shield detection unit includes a height measurement unit to measure a height of the detected shield, and the sound volume control unit controls the volume of the informing sound to be outputted by the informing sound output unit according to the height of the shield measured by the height measurement unit.

BRIEF DESCRIPTION OF THE DRAWINGS

FIG. 3A is a plan view illustrating the relationship between the vehicle and a shield, and FIG. 3B is a side view illustrating the relationship between the vehicle and the shield.

FIGS. 5A, 5B, and 5C are each a chart illustrating an informing sound volume reduction rate determination table; and FIG. 6 is a chart illustrating an informing sound volume reduction performance rate determination table.

DETAILED DESCRIPTION

Figure 1:
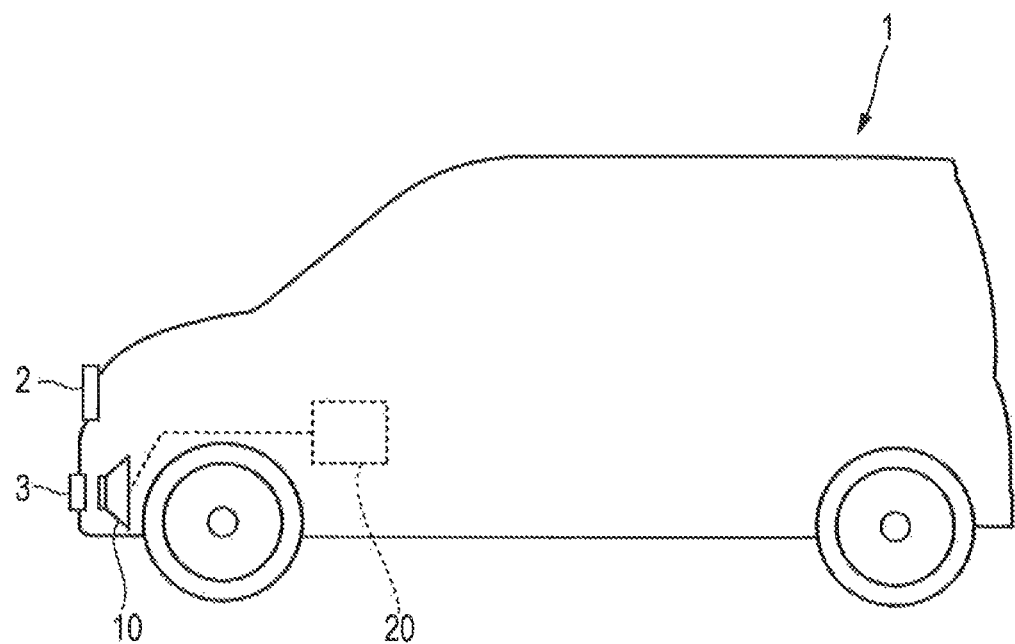
FIG. 1 is the overall configuration diagram of a vehicle.

Hereinafter, a preferable implementation of the present invention is described in detail with reference to the accompanying drawings. As illustrated in FIG. 1, a vehicle 1 provided with a vehicle approach informing device according to the implementation includes a pair of right and left informing speakers 10 in the front of the vehicle 1, and a vehicle approach informing controller 20 connected to the informing speakers 10 in the vehicle 1. In this implementation, each of the informing speakers 10 corresponds to the informing sound output unit of the present invention, and the vehicle approach informing controller 20 corresponds to the sound volume control unit of the present invention.

The informing speakers 10 are respectively disposed near the rear surfaces of a pair of right and left fog lamps which are disposed below headlights 2 at the front end of the vehicle 1. The diaphragm of each informing speaker 10 is cone type and disposed to face the rear of the vehicle 1. For informing the approach of the vehicle 1 to pedestrians outside, informing sound having an informing sound volume V is normally outputted from the informing speakers 10. In this implementation, the vehicle 1 includes two pieces of the informing speaker 10. However, without being limited to this, the vehicle 1 may include, for example, one piece of the informing speaker 10 or further additional pieces of the informing speaker 10 at the rear or a side of the vehicle 1.

Figure 2:
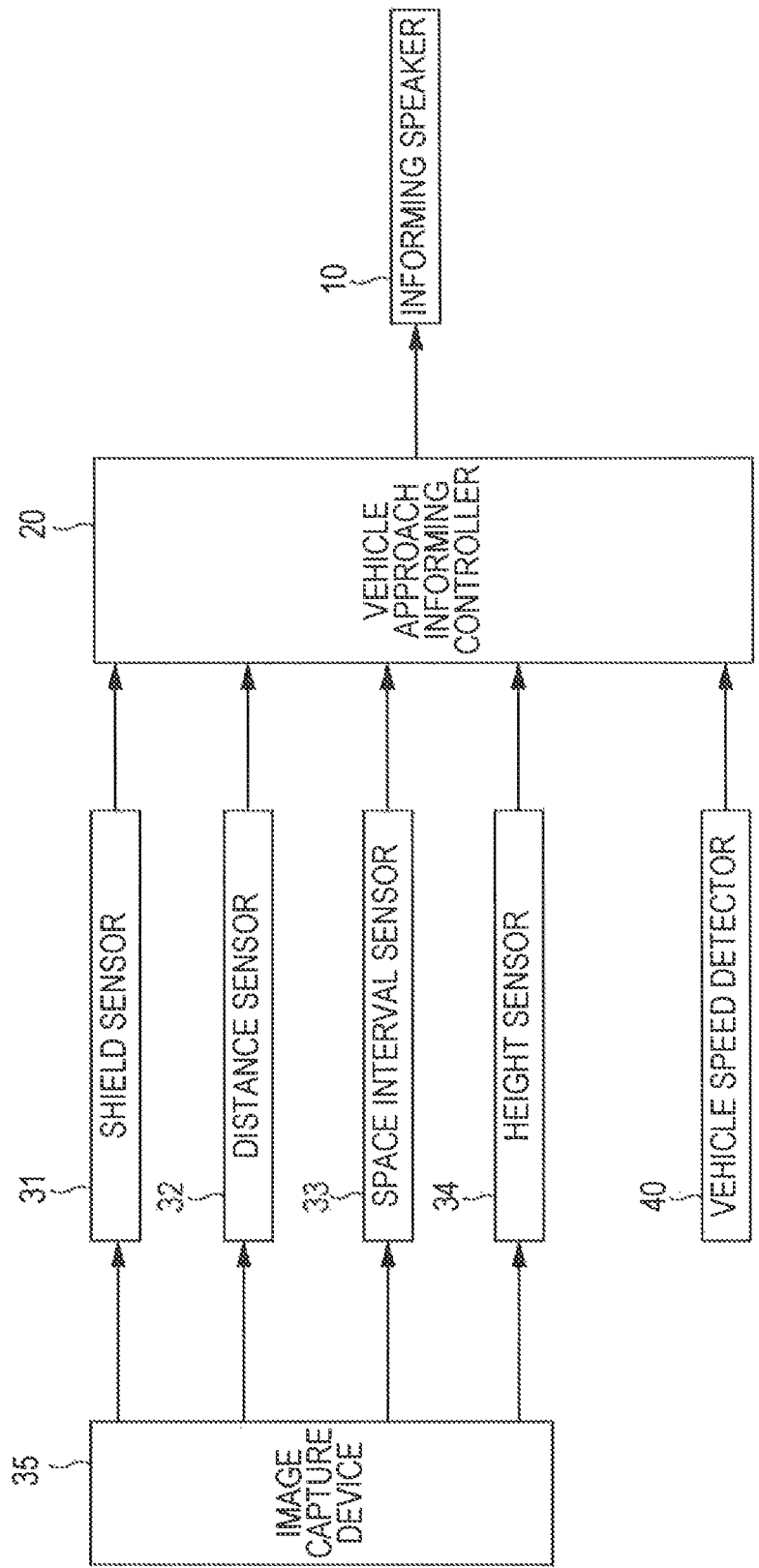
FIG. 2 is a block diagram of a vehicle approach informing device.

As illustrated in FIG. 2, the output side of the vehicle approach informing controller 20 is electrically connected to the informing speaker 10. Thus, the informing speaker 10 receives an informing sound output signal from the vehicle approach informing controller 20.

The input side of the vehicle approach informing controller 20 is electrically connected to a shield sensor 31 for detecting a shield on the right or left side ahead of the vehicle 1, a distance sensor 32 for measuring the distance from the vehicle 1 to the shield, a space interval sensor 33 for measuring the space interval between the shield and the corresponding side of the vehicle 1, a height sensor 34 for measuring the height of the shield, and a vehicle speed detector 40 for detecting the running speed. of the vehicle 1. Thus, the vehicle approach informing controller 20 receives a detected shield signal from the shield sensor 31, distance information from the distance sensor 32, space interval information from the space interval sensor 33, height information from the height sensor 34, and a detected vehicle speed signal from the vehicle speed detector.

The input sides of the shield sensor 31, the distance sensor 32, the space interval sensor 33, and the height sensor 34 are connected to an image capture device 35. The image capture device 35 is provided at the front end of the vehicle 1 to capture areas on both sides ahead of the vehicle 1 (the road and road shoulder in front of the vehicle 1), and outputs the captured image data to the shield sensor 31, the distance sensor 32, the space interval sensor 33, and the height sensor 34 for every predetermined time (for example, 4 milliseconds). In this implementation, the image capture device 35 includes a front camera which is mounted at the front end of the vehicle 1. However, without being limited to this, the image capture device 35 may include, for example, a pair of right and left side cameras mounted at the right and left side mirrors of the vehicle 1.

The shield sensor 31 analyzes the image data inputted from the image capture device 35 and detects a shield. Specifically, the shield sensor 31 analyzes the image data inputted from the image capture device 35 to recognize the presence of a lane and determines the path of the vehicle 1 on the image according to the lane. The shield sensor 31 then detects a shield beside the path of the vehicle 1. In this manner, for example, a fence, a wall, and a tunnel wall on the road. shoulder in the path of the vehicle 1 can be detected. The shield sensor 31 can detect a shield on each of the right side and the left side ahead in the running direction of the vehicle 1. That is to say, a shield may be detected only on the right side ahead in the running direction of the vehicle 1 or a shield may be detected on each of both sides ahead in the running direction of the vehicle 1. When a shield is detected on one side ahead in the path of the vehicle 1, the shield sensor 31 outputs either one of a left side shield detection. signal and a right side shield detection signal. When a shield is detected on each of both sides ahead in the path of the vehicle 1, the shield sensor 31 outputs a both side shield detection signal. In this implementation, the shield sensor 31 corresponds to the shield detection unit of the present invention.

The distance sensor 32 analyzes the image data inputted from the image capture device 35, and measures a distance D from the vehicle 1 to the shield (see FIG. 3A). In this manner, the distance D from the current position of the vehicle 1 to the shield detected by the shield sensor 31 can be measured. In this implementation, the distance sensor 32 corresponds to the distance measurement unit of the present invention.

The space interval sensor 33 analyzes the image data inputted from the image capture device 35, and measures space interval I between the shield and the corresponding side of the vehicle 1 (see FIG. 3A). The space interval is the distance from the corresponding side of the vehicle 1 to the shield under the assumption that the vehicle 1 is just beside a target shield. That is to say, the space interval is the distance of the space between the vehicle 1 and the shield when the vehicle 1 passes through a position of the shield. For example, when the shield is a tunnel for a road with one lane which is used exclusively by vehicles, a smaller value of the space interval I indicates that the tunnel has a narrower width. In this implementation, the space interval sensor 33 corresponds to the space interval measurement unit of the present invention.

The height sensor 34 analyzes the image data inputted from the image capture device 35 and measures a height T of a shield (see FIG. 3B). In this manner, the height T of the shield, which has been detected by the shield sensor 31, can be measured. In addition to the measuring of the height T of a shield, the height sensor 34 is capable of detecting whether the shield has a ceiling. In this manner, the height sensor 34 can determine not only that a shield is simply a wall, but also that a shield is an object such as a tunnel or a multi-level parking lot. When a ceiling of the shield is detected, the height sensor 34 outputs a ceiling detection signal as well as the height information. In this implementation, the height sensor 34 corresponds to the height measurement unit of the present invention.

In this implementation, the detection of the presence of a shield and the measurement of the distance D, the space interval I, and the height T are performed based on the data captured by the image capture device 35. However, without being limited to this, such a detection and measurement may be performed by, for example, a radar using electromagnetic waves or a sonar using ultrasonic waves. In addition, the detection of the presence of a shield and the measurement of the distance D, the space interval I, and the height T may be performed by using a navigation system having map data in which the installed positions and heights of shields are previously stored.

The vehicle speed detector 40 outputs a detected vehicle speed signal when it detects that the vehicle 1 runs at a predetermined running speed (30 km/h in the present implementation) or lower.

The vehicle approach informing controller 20 is an electronic control unit (ECU), which performs a procedure for informing pedestrians outside the vehicle 1 of the approach thereof by analyzing various input signals and outputting informing sound output signals to the informing speaker 10.

Figure 4:
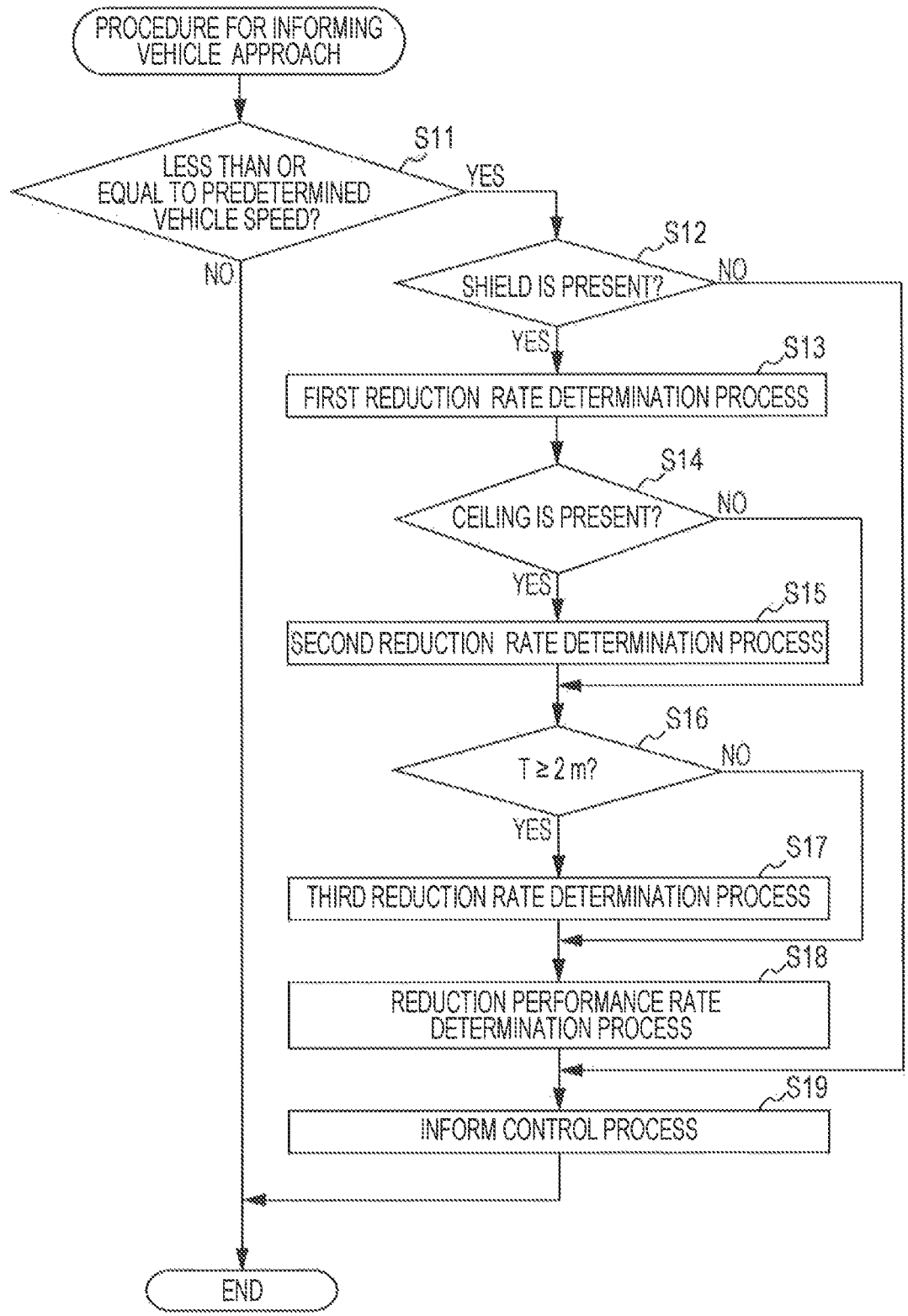
FIG. 4 is a flow chart illustrating a vehicle approach informing procedure.

Hereinafter, the vehicle approach informing procedure for informing pedestrians outside of the vehicle 1 of the approach thereof will be described with reference to FIGS. 4, 5, and 6. The procedure flow illustrated in FIG. 4 is performed for every predetermined period (for example, 4 milliseconds). A first informing sound volume reduction rate determination table, a second informing sound volume reduction rate determination table, and a third informing sound volume reduction rate determination table which are illustrated in FIG. 5, and an informing sound volume reduction performance rate determination table illustrated in FIG. 6 are stored in a read-only memory (ROM) which is contained in the vehicle approach informing controller 20.

First, in step S11, the vehicle approach informing controller 20 determines whether or not the speed of the vehicle 1 is lower than or equal to a predetermined vehicle speed (30 km/h). Specifically, when a detected vehicle speed signal is inputted from the vehicle speed detector 40, it is determined that the speed of the vehicle 1 is lower than or equal to the predetermined vehicle speed, and when no detected vehicle speed signal is inputted from the vehicle speed detector 40, it is determined that the speed of the vehicle 1 is higher than the predetermined vehicle speed. When it is determined that the speed of the vehicle 1 is lower than or equal to the predetermined vehicle speed, the procedure proceeds to step S12, and when it is determined that the speed of the vehicle 1 is higher than the predetermined vehicle speed, the vehicle approach informing procedure is terminated.

In step S12, the vehicle approach informing controller 20 determines whether or not a shield is present on any side (such as a road shoulder) ahead in the running direction of the vehicle 1. Specifically, when a shield detection signal is inputted from the shield sensor 31, the vehicle approach informing controller 20 determines that a shield is present on any side ahead in the running direction of the vehicle 1, and when no shield detection signal is inputted from the shield sensor 31, the vehicle approach informing controller 20 determines that no shield is present on each side ahead in the running direction of the vehicle 1. When a shield detection signal is inputted from the shield sensor 31, the procedure proceeds to step S13, and when no shield detection signal is inputted from the shield sensor 31, the procedure proceeds to step S19.

In step S13, the vehicle approach informing controller 20 performs a first reduction rate determination process for determining a reduction rate of the volume of informing sound for informing of the approach of the vehicle 1 to pedestrians outside. That is, informing sound volume V is used as the normal volume of the informing sound outputted from the informing speaker 10, but when a shield is present on any side ahead in the running direction of the vehicle 1, a reduction rate of the informing sound volume is determined in step S13.

Specifically, the vehicle approach informing controller 20 refers to the first informing sound volume reduction rate determination table illustrated in FIG. 5 to determine a reduction rate of the informing sound volume according to whether a shield is present only on one side or both sides ahead in the running direction of the vehicle 1. For example, when a right side shield detection signal is inputted from the shield sensor 31, a shield is present only on the right, side ahead in the running direction, and thus the reduction rate of the informing sound volume is determined to be 25%. Therefore, when a fence or a wall is present only on one side ahead in the running direction of the vehicle 1, the reduced informing sound volume is 75% of the informing sound volume V. In addition, when a both side shield detection signal is inputted from the shield sensor 31, a shield is present on each of both sides ahead in the running direction, and thus the reduction rate of the informing sound volume is determined to be 50%. Therefore, when a fence or a wall is present on each of both sides ahead in the running direction of the vehicle 1, the reduced informing sound volume is 50% of the informing sound volume V.

In step S14, the vehicle approach informing controller 20 determines whether or not the shield has a ceiling. Specifically, when a ceiling detection signal is inputted from the height sensor 34, the vehicle approach informing controller 20 determines that the shield has a ceiling, and when no ceiling detection signal is inputted from the height sensor 34, the vehicle approach informing controller 20 determines that the shield has no ceiling. When a ceiling detection signal is inputted from the height sensor 34, the procedure proceeds to step S15, and when no ceiling detection. signal is inputted, the procedure proceeds to step S16.

In step S15, the vehicle approach informing controller 20 performs a second reduction rate determination process for determining a reduction rate of the volume of informing sound for informing of the approach of the vehicle 1 to pedestrians outside. That is, when the shield has a ceiling, a further reduction rate of the informing sound volume is determined in step S15.

Specifically, the vehicle approach informing controller 20 refers to the second informing sound volume reduction rate determination table illustrated in FIG. 5 to determine a reduction rate of the informing sound volume. That is, when the shield has a ceiling, and the shield is an object such as a tunnel and a multi-level parking lot, the reduction rate of the informing sound volume is determined to be 25%.

In step S16, the vehicle approach informing controller 20 determines whether or not the height T of the shield is greater than or equal to a predetermined height (2 m in the present implementation). Specifically, the vehicle approach informing controller 20 analyzes the height information inputted from the height sensor 34, and determines the height T of the shield. When it is determined that the height T of the shield is greater than or equal to 2 m, the procedure proceeds to step S17, and when it is determined that the height T of the shield is less than 2 m, the procedure proceeds to step S18.

In step S17, the vehicle approach informing controller 20 performs a third reduction rate determination process for determining a reduction rate of the volume of informing sound for informing the approach of the vehicle 1 to pedestrians outside. That is, when the height T of the shield is greater than or equal to a predetermined height, a further reduction rate of the informing sound volume is determined in step S17.

Specifically, the vehicle approach informing controller 20 refers to the third informing sound volume reduction rate determination table illustrated in FIG. 5 to determine a reduction rate of the informing sound volume. That is, when the height T of the shield is greater than or equal to 2 m, the reduction rate for informing sound volume is determined to be 10%.

In the present implementation, the process of determining a reduction rate of the informing sound volume is performed in at most three processes, that is, the first reduction rate determination process in step S13, the second reduction rate determination process in step S15, and the third reduction rate determination process in step S17. The reduction rates determined in the above reduction rate determination processes are added together and applied to the informing sound volume V. That is, for example, when a shield is present on each of both sides ahead in the running direction of the vehicle 1, the shield has a ceiling, and the height T of the shield is greater than or equal to 2 m, the reduction rate of the informing sound volume is 85%, and thus the reduced informing sound volume is 15% of the informing sound volume V. When the height T is less than 2 m and a shield with no ceiling is present only on one side ahead in the running direction of the vehicle 1, the informing sound volume is reduced by 25% and becomes 75% of the informing sound volume V. Alternatively, instead of adding together the reduction rates determined by all the reduction. rate determination processes, for example, the greatest reduction rate may be applied to the informing sound volume V.

In step S18, the vehicle approach informing controller 20 performs reduction performance rate determination process for determining a performance rate for reduction rates determined by the first reduction rate determination process in step S13, the second reduction rate determination process in step S15, and the third reduction rate determination process in step S17. Specifically, the vehicle approach informing controller 20 refers to the informing sound volume reduction performance rate determination table illustrated in FIG. 6, and determines a performance rate for informing sound volume reduction based on the distance information inputted from the distance sensor 32 and the space interval information inputted from the space interval sensor 33.

For example, when the distance D from the vehicle 1 to the shield is found to be greater than or equal to 10 m after analyzing the input distance information, the performance rate for informing sound volume reduction is set to 0%. That is, when the shield is away from the vehicle 1 by 10 m or greater, the informing sound volume reduction determined by the informing sound volume reduction processes is not performed, and informing sound having the informing sound volume V is outputted. When the distance D is less than 10 m and not 0 m, the performance rate for informing sound volume reduction is set to 50%. That is, when the vehicle 1 approaches the shield at a distance less than 10 m and has not reached the shield yet, only 50% of the informing sound volume reduction is performed. In this case, for example, when a total of 50% of informing sound volume reduction is determined by the above-described informing sound volume reduction processes, 25% of informing sound volume reduction is performed (the reduced informing sound volume is 75% of the informing sound volume V). Furthermore, when the distance D is 0 m (when the shield is present on any side of the vehicle 1), the performance rate for informing sound volume reduction is set to 100%, and thus informing sound volume reduction is performed at the rate which has been determined by the above-described informing sound volume reduction processes.

For example, when the space interval I between a shield and a corresponding side of the vehicle 1 is found to be greater than or equal to 3 m after analyzing the space interval information, the performance rate for informing sound volume reduction is set to 0%. That is, when the space interval between the shield and the corresponding side of the vehicle 1 is 3 m or greater, the informing sound volume reduction determined by the above-described informing sound volume reduction processes is not performed, and informing sound having the informing sound volume V is outputted. When the space interval I is 1 m or greater and less than 3 m, the performance rate for informing sound volume reduction is set to 50%. In addition, when the space interval I is less than 1 m, the performance rate for informing sound volume reduction is set to 100%, and informing sound volume reduction is performed at the rate which has been determined by the above-described informing sound volume reduction processes.

The reduction performance rate according to the distance D and the reduction performance rate according to the space interval I are applied independently. That is when the reduction performance rate according to the distance D is 50% and the reduction performance rate according to the space interval I is 50%, the reduction performance rates are applied independently, and thus 25% of informing sound volume reduction is applied to the informing sound volume V as a consequence. When the distance D is greater than or equal to 10 m or when the space interval I is greater than or equal to 3 m, reduction of informing sound volume is not performed. For example, when the distance D is greater than or equal to 10 m, reduction of informing sound volume is not performed even when the space interval I is less than 1 m, and informing sound having the informing sound volume V is outputted.

In step S19, the vehicle approach informing controller 20 performs an inform control process of outputting informing sound from the informing speaker 10, the informing sound for informing the approach of the vehicle 1 to pedestrians outside. Specifically, the vehicle approach informing controller 20 outputs an informing sound output signal from the informing speaker 10 for outputting at a predetermined volume. In the above step, when sound volume reduction is not performed, that is, when no shield is present, a shield is present and yet the distance D is greater than or equal to 10 m, or the space interval I is greater than or equal to 3 m, informing sound having the informing sound volume V is outputted.

On the other hand, when sound volume reduction is performed, informing sound is outputted at a volume according to sound volume reduction rates and a reduction performance rate, the sound volume reduction rates being determined, by the first reduction rate determination process in step S13, the second reduction rate determination process in step S15, and the third reduction rate determination process in step S17, the reduction performance rate being determined by step S18. For example, when the sound volume reduction rates, which are determined by the first reduction rate determination process, the second reduction rate determination process, and the third reduction rate determination process, have a total of 50%, and the reduction performance rate determined by the reduction performance rate determination process is 50%, 25% of informing sound volume reduction is performed, and thus the informing sound volume is 75% of the informing sound volume V.

As described above, when a shield is present on any side ahead in the running direction of the vehicle 1, the volume of informing sound for informing the approach of the vehicle 1 is reduced, and consequently informing sound, which reverberates through the shield, can be prevented from becoming an annoying noise.

When a shield is present on each of both sides, sound, which reverberates through a shield on one side, also reverberates through a shield on the other side, and thus sound tends to be amplified more than the sound does when a shield is present only on one side. When a shield has a ceiling, sound reverberates through the ceiling, and thus sound tends to reverberate more than the sound does when a shield has no ceiling. In addition, when a shield is high, sound tends to reverberate more than the sound does when a shield is low. On the other hand, as described above, when a shield is present on each of both sides, the informing sound volume is reduced more than the informing sound volume when a shield is present only on one side. In addition, when a shield has a ceiling, the informing sound volume is reduced, and when the height T of a shield is greater than or equal to a predetermined height, the informing sound volume is reduced, On the other hand, when a shield is away from the vehicle 1 by a predetermined distance or greater, or the space interval between the shield and the vehicle 1 is greater than or equal to a predetermined interval, informing sound is unlikely to reverberate through the shield, and thus reduction of informing sound is not performed.

In this manner, the more the shield allows sound to reverberate therethrough, the more the sound volume of informing sound is reduced, the informing sound being outputted for informing of approach of the vehicle 1. Thus, the informing sound can be prevented from being an annoying noise more effectively. In addition, reduction in the informing sound volume more than necessary and corresponding decrease in the informing effect can be prevented, the reduction causing pedestrians and the like to be unable to hear the informing sound. That is, according to this implementation, informing sound volume is reduced in relation to the likelihood of reverberation of sound through a shield, thus informing sound can be prevented from being an annoying noise while maintaining an informing effect on pedestrians outside.

In this implementation, pedestrians are informed of the approach of the vehicle 1 on the condition that the speed of the vehicle 1 is less than or equal to the predetermined vehicle speed. However, without being limited to this condition, pedestrians may be informed of the approach of the vehicle 1 on another condition.

The invention claimed is:

1. A vehicle approach informing device comprising:
   an informing sound output unit to output informing sound for informing a pedestrian outside a vehicle that the vehicle is approaching when a predetermined condition is satisfied;
   a sound volume control unit to control the volume of the informing sound outputted by the informing sound output unit; and
   a shield detection unit configured to detect a shield present on any side ahead in the running direction of the vehicle,
   wherein, when a shield is detected by the shield detection unit, the sound volume control unit reduces the sound volume of the informing sound to be outputted by the informing sound output unit, and
   wherein when a shield is detected on each of both sides ahead in the running direction of the vehicle by the shield detection unit, the sound volume control unit reduces the volume of the informing sound to a lower level than the volume of the informing sound when a shield is detected only on one side ahead in the running direction of the vehicle.

2. The vehicle approach informing device according to claim 1, wherein
   the shield detection unit includes a distance measurement unit to measure a distance between the detected shield and the vehicle; and
   the sound volume control unit controls the volume of the informing sound to be outputted by the informing sound output unit according to the distance measured by the distance measurement unit.

3. The vehicle approach informing device according to claim 2, wherein
   the shield detection unit includes a space interval measurement unit configured to measure a space interval between the detected shield and the corresponding side of the vehicle; and
   the sound volume control unit controls the volume of the informing sound to be outputted by the informing sound output unit according to the space interval measured by the space interval measurement unit.

4. The vehicle approach informing device according to claim 3, wherein
   the shield detection unit includes a height measurement unit configured to measure a height of the detected shield; and
   the sound volume control unit controls the volume of the informing sound to be outputted by the informing sound output unit according to the height of the shield measured by the height measurement unit.

5. The vehicle approach informing device according to claim 2, wherein
   the shield detection unit includes a height measurement unit configured to measure a height of the detected shield; and
   the sound volume control unit controls the volume of the informing sound to be outputted by the informing sound output unit according to the height of the shield measured by the height measurement unit.

6. The vehicle approach informing device according to claim 1, wherein
   the shield detection unit includes a space interval measurement unit configured to measure a space interval between the detected shield and the corresponding side of the vehicle; and
   the sound volume control unit controls the volume of the informing sound to be outputted by the informing sound output unit according to the space interval measured by the space interval measurement unit.

7. The vehicle approach informing device according to claim 6, wherein
   the shield detection unit includes a height measurement unit configured to measure a height of the detected shield; and
   the sound volume control unit controls the volume of the informing sound to be outputted by the informing sound output unit according to the height of the shield measured by the height measurement unit.

8. The vehicle approach informing device according to claim 1, wherein
   the shield detection unit includes a height measurement unit configured to measure a height of the detected shield; and
   the sound volume control unit controls the volume of the informing sound to be outputted by the informing sound output unit according to the height of the shield measured by the height measurement unit.

9. The vehicle approach informing device according to claim 1, wherein the informing sound output unit outputs a pedestrian warning sound with a speaker positioned for sound output directed external to the vehicle.

10. The vehicle approach informing device according to claim 9, wherein the speaker is positioned at a front end of the vehicle external to an operator compartment of the vehicle.

* * * * *